(12) United States Patent
Koo et al.

(10) Patent No.: US 11,417,627 B2
(45) Date of Patent: Aug. 16, 2022

(54) MICRO LED DISPLAY AND MANUFACTURING METHOD WITH CONDUCTIVE FILM

(71) Applicant: Samsung Electronics Co., Ltd., Suwon-si (KR)

(72) Inventors: Jamyeong Koo, Suwon-si (KR); Sungyong Min, Suwon-si (KR); Byunghoon Lee, Suwon-si (KR); Changjoon Lee, Suwon-si (KR); Changkyu Chung, Suwon-si (KR); Youngkyong Jo, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 16/992,004

(22) Filed: Aug. 12, 2020

(65) Prior Publication Data

US 2021/0050336 A1    Feb. 18, 2021

(30) Foreign Application Priority Data

Aug. 12, 2019  (KR) .......................... 10-2019-0098377

(51) Int. Cl.
*H01L 23/00* (2006.01)
*H01L 25/16* (2006.01)
(Continued)

(52) U.S. Cl.
CPC ............. *H01L 24/83* (2013.01); *H01L 24/29* (2013.01); *H01L 24/30* (2013.01); *H01L 24/32* (2013.01);
(Continued)

(58) Field of Classification Search
CPC ..... H01L 25/0753; H01L 25/50; H01L 24/29; H01L 24/30; H01L 24/32; H01L 24/33;
(Continued)

(56) References Cited

U.S. PATENT DOCUMENTS 6,340,607 B1 * 1/2002 Yamada ................. H01L 24/29
438/106
6,461,890 B1 * 10/2002 Shibata .................. H01L 24/27
257/E21.514
(Continued)

FOREIGN PATENT DOCUMENTS

JP      2019-015899 A      1/2019
KR     10-1232409 B1      2/2013
(Continued)

OTHER PUBLICATIONS

International Search Report and Written Opinion of the International Searching Authority in connection with International Application No. PCT/KR2020/010652 dated Nov. 30, 2020, 7 pages.

*Primary Examiner* — Scott B Geyer

(57) ABSTRACT

A micro LED display manufacturing method according to various embodiments may include: a first operation of bonding an anisotropic conductive film including a plurality of conductive particles onto one surface of a prepared substrate, the one surface including a circuit part; a second operation of forming a bonding layer on the anisotropic conductive film; a third operation of positioning a plurality of micro LED chips above the bonding layer, the micro LED chips being arranged on a carrier substrate while being spaced a first distance apart from the substrate; a fourth operation of attaching the plurality of micro LED chips onto the bonding layer by means of laser transfer; and a fifth operation of forming a conductive structure for electrically connecting a connection pad to the circuit part through the conductive particles by means of heating and pressurizing.

16 Claims, 17 Drawing Sheets

(51) Int. Cl.
*H01L 25/075* (2006.01)
*H01L 25/00* (2006.01)

(52) U.S. Cl.
CPC .......... *H01L 24/33* (2013.01); *H01L 25/0753* (2013.01); *H01L 25/167* (2013.01); *H01L 25/50* (2013.01); *H01L 2224/29339* (2013.01); *H01L 2224/29344* (2013.01); *H01L 2224/29347* (2013.01); *H01L 2224/29355* (2013.01); *H01L 2224/29499* (2013.01); *H01L 2224/30517* (2013.01); *H01L 2224/32227* (2013.01); *H01L 2224/3303* (2013.01); *H01L 2224/33517* (2013.01); *H01L 2224/83005* (2013.01); *H01L 2224/83051* (2013.01); *H01L 2224/83192* (2013.01); *H01L 2224/83203* (2013.01); *H01L 2224/83224* (2013.01); *H01L 2224/83851* (2013.01); *H01L 2924/12041* (2013.01)

(58) Field of Classification Search
CPC ...................... H01L 24/83; H01L 24/27; H01L 2224/83851; H01L 2224/83203; H01L 2224/83224; H01L 2224/30–30519; H01L 2224/83001–83005; H01L 2224/83051
See application file for complete search history.

(56) References Cited

U.S. PATENT DOCUMENTS

| | | | | |
|---|---|---|---|---|
| 6,737,300 | B2* | 5/2004 | Ding | H01L 21/563 257/E21.503 |
| 9,023,464 | B2* | 5/2015 | Akutsu | H01L 24/32 428/323 |
| 10,193,012 | B2 | 1/2019 | Zou et al. | |
| 2009/0217517 | A1* | 9/2009 | Pique | H05K 3/321 29/832 |
| 2011/0237028 | A1 | 9/2011 | Hamazaki et al. | |
| 2013/0093081 | A1* | 4/2013 | Lin | H01L 24/13 257/737 |
| 2014/0175481 | A1* | 6/2014 | Tischler | H01L 31/048 257/98 |
| 2014/0317915 | A1* | 10/2014 | Eom | H05K 3/3485 29/825 |
| 2014/0346684 | A1* | 11/2014 | Kojima | H01L 24/29 257/783 |
| 2015/0171297 | A1 | 6/2015 | Rhee et al. | |
| 2015/0228617 | A1* | 8/2015 | Lee | H01L 24/81 257/772 |
| 2016/0111181 | A1* | 4/2016 | Chang | H01L 24/32 257/737 |
| 2017/0062379 | A1* | 3/2017 | Zhang | H01L 24/16 |
| 2017/0271290 | A1* | 9/2017 | Liao | H01L 24/73 |
| 2017/0330857 | A1* | 11/2017 | Zou | H01L 24/97 |
| 2017/0338199 | A1* | 11/2017 | Zou | H01L 33/0093 |
| 2017/0352716 | A1* | 12/2017 | Lee | H01L 27/3276 |
| 2018/0182944 | A1* | 6/2018 | Miles | H01L 21/6835 |
| 2018/0333945 | A1* | 11/2018 | Li | B32B 37/12 |
| 2018/0374829 | A1* | 12/2018 | Henley | H01L 33/0093 |
| 2020/0091385 | A1* | 3/2020 | Hsieh | H01L 33/62 |
| 2020/0381590 | A1* | 12/2020 | Yanagisawa | H01L 25/0753 |
| 2021/0005588 | A1* | 1/2021 | Chung | H01L 21/6835 |

FOREIGN PATENT DOCUMENTS

| | | |
|---|---|---|
| KR | 10-1620469 B1 | 5/2016 |
| KR | 10-1890934 B1 | 8/2018 |
| KR | 10-2018-0112197 A | 10/2018 |
| KR | 10-1972481 B1 | 4/2019 |
| KR | 10-2020-0007498 A | 1/2020 |
| WO | 2020/013478 A1 | 1/2020 |

* cited by examiner

MICRO LED DISPLAY AND MANUFACTURING METHOD WITH CONDUCTIVE FILM

CROSS-REFERENCE TO RELATED APPLICATION

This application is based on and claims priority under 35 U.S.C. 119 to Korean Patent Application No. 10-2019-0098377 filed on Aug. 12, 2019 in the Korean Intellectual Property Office, the disclosure of which is herein incorporated by reference in its entirety.

BACKGROUND

1. Field

Various embodiments of the present disclosure relate to a micro light emitting diodes (LED) display and a manufacturing method thereof.

2. Description of Related Art

In addition to the continuous development direction, such as high luminance, high resolution, and enlargement, of a display mounted in various electronic devices, a requirement of high efficiency and low power has recently increased according to a trend of an eco electronic device. Accordingly, an organic LED (OLED) panel is drawing attention as a new display to replace a liquid crystal display (LCD) panel, but reliability, enlargement, and a high price due to a low mass production yield rate, still remain as a challenge to overcome.

Research on technology of making a display panel as a new production to replace or complement the OLED panel, by directly mounting LEDs emitting colored lights, such as a red (R), a green (G), and a blue (B) light, on a substrate has been attempted.

The above information is presented as background information only to assist with an understanding of the present disclosure. No determination has been made, and no assertion is made, as to whether any of the above might be applicable as prior art with regard to the present disclosure.

SUMMARY

However, in order to realize a display, the development of a micro LED capable of corresponding to a current pixel is required, and the following problems may first be solved. The problems include how to pick up a micro LED chip of several tens of micrometers and how precisely a micro LED chip is transferred onto a substrate, and how to electrically connect an electrode of several micrometers positioned on a micro LED chip of several tens of micrometers with a substrate.

The use of a metal wire bonding method may be limited due to a complicated process, a low throughput, and instability of a metal wire for connecting a substrate and an element.

A flip-chip bonding method using a solder bump, which is used to replace the metal wire bonding method, also has limitations. The flip-chip bonding method is a widely used method, but the flip-chip bonding method has a disadvantage in which each bump may be patterned on an electrode, and it is known that patterning bumps of several micrometers is difficult.

Various embodiments provide a micro LED display which is suitable for the connection of a micro LED chip having micro dimensions and is applicable to a large-area process while having a high throughput, and a manufacturing method thereof.

Various embodiments provide a micro LED display for electrically and physically connecting a substrate and an electronic element by using conductive particles included in an anisotropic conductive film, and a manufacturing method thereof.

A micro LED display manufacturing method according to various embodiments may include: a first operation of bonding an anisotropic conductive film including a plurality of conductive particles onto one surface of a prepared substrate, the one surface including a circuit part; a second operation of forming a bonding layer on the anisotropic conductive film; a third operation of positioning a plurality of micro LED chips above the bonding layer, the micro LED chips being arranged on a carrier substrate while being spaced a first distance apart from the substrate; a fourth operation of attaching the plurality of micro LED chips onto the bonding layer by means of laser transfer; and a fifth operation of forming a conductive structure for electrically connecting a connection pad to the circuit part through the conductive particles by means of heating and pressurizing.

A micro LED display according to various embodiments may include: a substrate including a circuit part on one surface thereof; an anisotropic conductive film bonded to the one surface of the substrate and including a plurality of conductive particles; a plurality of micro LED chips attached onto the anisotropic conductive film; and a conductive structure disposed between the circuit part and a connection pad of each of the micro LED chips by means of the plurality of conductive particles.

According to the present disclosure, an electronic element such as a micro LED chip can easily have an electrical connection with a substrate through simple processes of curing, laser transfer, and bonding of an anisotropic conductive film including conductive particles of several micrometers or lower.

According to the present disclosure, a manufacturing process is very simple and thus can contribute the improvement of a yield rate of a large-area process of a display element such as a micro LED display.

Before undertaking the DETAILED DESCRIPTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like.

Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present disclosure and its advantages, reference is now made to the following description taken in conjunction with the accompanying drawings, in which like reference numerals represent like parts.

DETAILED DESCRIPTION

Figure 1:
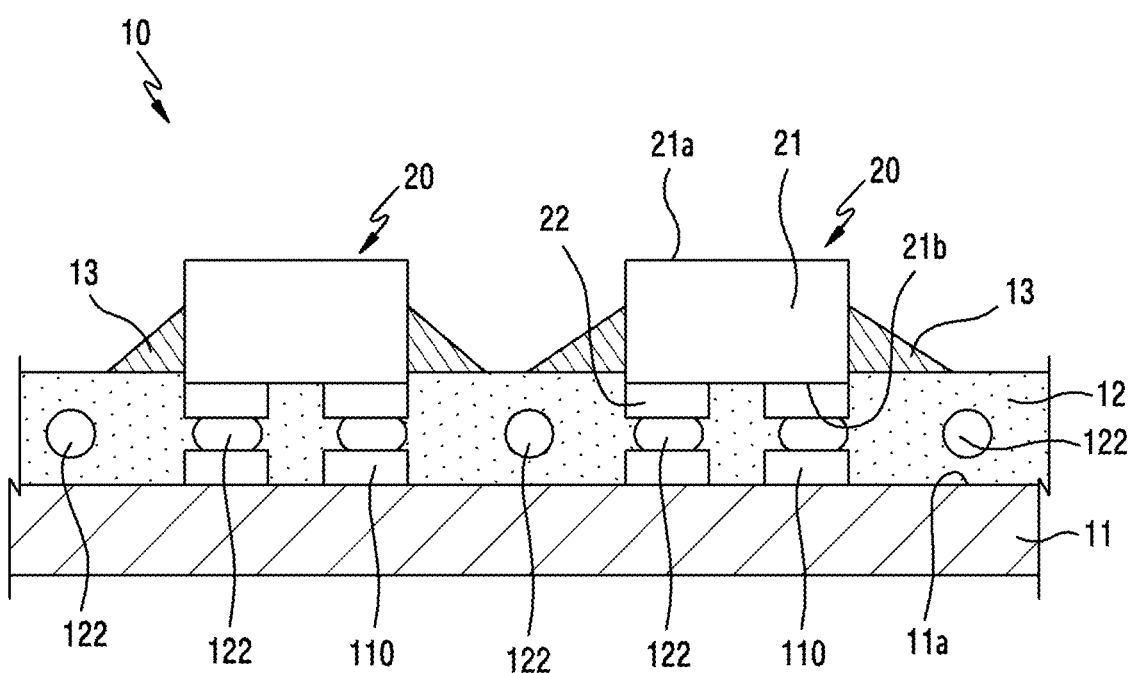
FIG. 1 illustrates an enlarged cross-sectional view of a micro LED display according to various embodiments.

FIGS. 1 through 10, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged system or device.

Hereinafter, referring to attached drawings, various embodiments will be described. However, it is not intended to limit the present disclosure to a specific embodiment, and it should be understood to include various modifications, equivalents, and/or alternatives of embodiments. In regard to the description of the drawings, similar reference numerals may be used to designate similar elements.

FIG. 1 illustrates a cross-sectional view of a structure of a micro LED display according to various embodiments.

Referring to FIG. 1, a display device 10, according to one embodiment, is a display element using a structure in which a plurality of light-emitting elements is arranged on a substrate 11 to emit light, and may be a display device including a plurality of chips such as micro LED chips 20 attached thereto. According to one embodiment, the display device 10 may include the substrate 11, an anisotropic conductive film (ACF) 12, a bonding agent-coated layer 13, and the plurality of micro LED chips 20.

According to one embodiment, a plurality of light-emitting elements such as the micro LED chips 20 serves as display light sources and may become conductive after being attached onto the substrate 11. For example, each of the micro LED chips 20 has a size of approximately 100 micrometers or lower and the size may be commonly within a range of several micrometers to tens of micrometers.

According to one embodiment, the micro LED chip 20 may include a light-emitting body 21 and a connection pad 22. According to one embodiment, one surface 21a of the light-emitting body 21 may be a surface for emitting light, and the other surface 21b may be a surface on which the connection pad 22 is disposed. According to one embodiment, the plurality of micro LED chips 20 may be attached onto the anisotropic conductive film 12 in a connection pad-down state. According to one embodiment, since the connection pad 22 is positioned in the anisotropic conductive film 12, the micro LED chip 20 may be disposed to be connected to a conductive particle 122. According to one embodiment, the anisotropic conductive film 12 may be a both-sided bonding film, namely a mixture of a bonding agent to be cured by heat and minute conductive particles within the bonding agent.

According to one embodiment, the substrate 11 may be a support base that enables a plurality of electronic elements such as the micro LED chips 20, which is used as a light-emitting element of a display, to be attached thereto while being aligned. For example, the substrate 11 may be made of one of glass, sapphire, a synthetic resin, or ceramic. According to one embodiment, the substrate 11 may be made of a rigid material or a flexible material. According to one embodiment, a circuit part 110 such as an electrode, which is made of a conductive material, may be disposed on the one surface 11a of the substrate 11, the one surface being connected to the micro LED chips 20. For example, the circuit part 110 may be a thin film transistor (TFT) circuit, an indium tin oxide (ITO) layer, or an upper layer thereof. According to one embodiment, the circuit part 110 may have a shape of a layer and be disposed on the one surface of the substrate 11. According to one embodiment, the circuit part 110 may be disposed to protrude or be recessed from the one surface of the substrate 11.

According to one embodiment, the anisotropic conductive film 12 may be disposed on the one surface of the substrate 11. According to one embodiment, the anisotropic conductive film 12 is a bonding layer for fixing the micro LED chips and connecting the micro LED chip and the circuit part and may include a plurality of dispersed conductive particles 122. For example, each of the conductive particles 122 may have a size of 0.1 to 10 micrometers. Each of the conductive particles 122 may have a size of 5.5 micrometers or lower. According to one embodiment, the conductive particles 122 may be arranged at an equal interval in the anisotropic conductive film 12. According to one embodiment, some conductive particles 122 positioned between the connection pad 22 and the circuit part 110 among the plurality of conductive particles 122 contained in the anisotropic conductive film 12 may not be spherical due to the plastic deformation during a manufacturing process.

According to one embodiment, one or more conductive particles 122 may be a conductive structure for electrically connecting the connection pad 22 of the micro LED chip and the circuit part 110 of the substrate 11.

According to one embodiment, the anisotropic conductive film 12 may be a support structure for supporting each of the arranged micro LED chips 20, and since the anisotropic conductive film includes the plurality of conductive particles 122, the anisotropic conductive film may be a part of a conductive structure for electrically connecting the micro LED chip 20 and the circuit part 110 of the substrate 11.

According to one embodiment, the micro LED display 10 may have a conductive structure for the micro LED chip 20, the conductive structure being obtained by means of a connection structure among the connection pad 22 of the micro LED chip 20, the plurality of conductive particles 122, and the circuit part 110 of the substrate 11. According to one embodiment, some of the conductive particles 122 may be mixed with the bonding agent coated on the anisotropic conductive film 12.

According to one embodiment, a surface of the connection pad 22 or the circuit part 110 may be made of a transparent electrode such as ITO, CNT, metal nano wire, and graphene, and an adhesion metal deposition layer made of a material such as Mo, Ti, and W, or one of Au, Cu, Ni, Co, or a conductive polymer.

According to one embodiment, the bonding agent coated on the periphery of each of the micro LED chips 20 is cured to be used as a bonding strength reinforcing structure. Hereinafter, the cured bonding agent 13 is referred to as a bonding strength reinforcing structure.

According to one embodiment, the bonding strength reinforcing structure 13 may be provided as a structure surrounding a lateral surface of each of the micro LED chips 20. According to one embodiment, the bonding strength reinforcing structure 13 is attached to the lateral surface of each of the micro LED chips 20 while being attached to the anisotropic conductive film, so as to fix a bonding state of each of the micro LED chips 20. For example, bonding strength reinforcing structures 13 may be disposed to be spaced apart from each other or connected to each other.

FIGS. 2A to 2E illustrate a cross-sectional view of a process for manufacturing a micro LED display according to various embodiments.

Figure 2A:
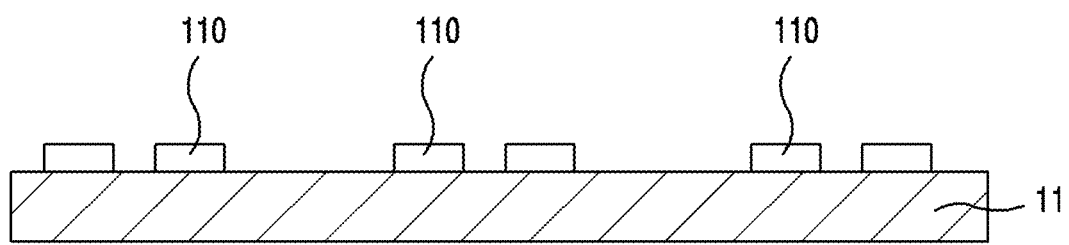
FIGS. 2A-2F illustrate a cross-sectional view of a process for manufacturing a micro LED display according to various embodiments.

Referring to FIG. 2A, according to one embodiment, the circuit part 110 may be disposed on the one surface of the prepared substrate 11. For example, the circuit part 110 is an electrode disposed on the substrate and may be a TFT circuit. According to one embodiment, the circuit part 110 may be formed on the one surface of the substrate 11 by means of plating, deposition, or patterning of a conductive material. For example, the substrate 11 and the circuit part 110 may be collectively referred to as the circuit board 11.

Figure 2B:
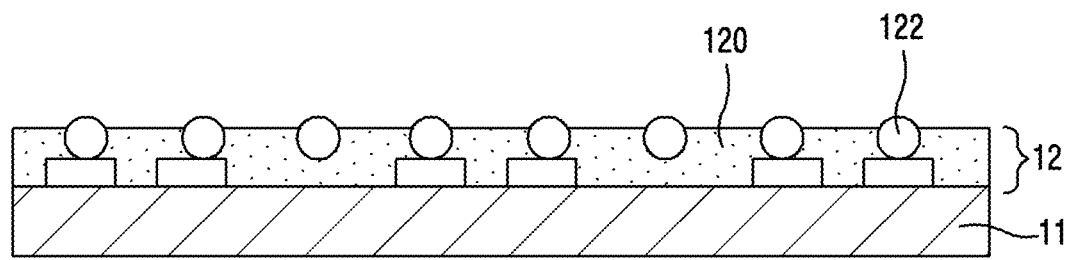

Referring to FIG. 2B, according to one embodiment, the anisotropic conductive film 12 having a first thickness may be pre-bonded onto the prepared substrate 11. According to one embodiment, the anisotropic conductive film 12 may be attached onto the one surface of the substrate 11 by means of heat and pressure. Therefore, the anisotropic conductive film 12 may be a bonding layer to be attached onto the substrate 11.

According to one embodiment, the anisotropic conductive film 12 may include a bonding film 120 and the plurality of conductive particles 122 in the bonding film. For example, the plurality of conductive particles 122 may be arranged at an equal interval in the bonding film 120. For example, the plurality of conductive particles 122 is metal particles and may include one of Cu, Ni, Au, or Ag.

Figure 2C:
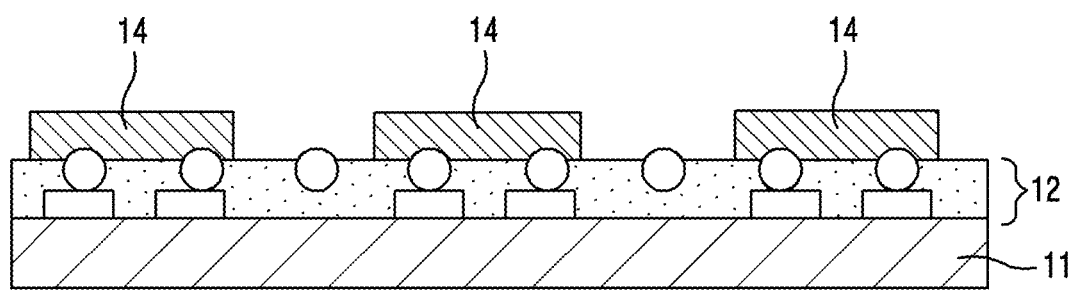

Referring to FIG. 2C, according to one embodiment, a bonding layer 14 may be formed by the application of a bonding agent to the anisotropic conductive film 12. According to one embodiment, the bonding layer 14 may be entirely or partially applied to the one surface of the substrate 11. For example, when the bonding layer 14 is partially applied to the substrate 11, the bonding layer may be applied to the periphery of the circuit part 110.

According to one embodiment, the bonding layer 14 may be a tacky layer which absorbs kinetic energy of the plurality of micro LED chips 20 having been separated from a carrier substrate during a laser transfer process, prevents the attached micro LED chips 20 from becoming askew, and temporally fixes the attached micro LED chips.

For example, a method for applying the bonding layer 14 to the anisotropic conductive film 12 may be one of dispensing, jetting, stencil printing, screen printing, bar coating, rolling coating, gravure printing, or reverse-offset printing methods. The bonding layer 14 having a predetermined thickness may be disposed on the anisotropic conductive film 12 as a layer by means of the various methods above.

Figure 2D:
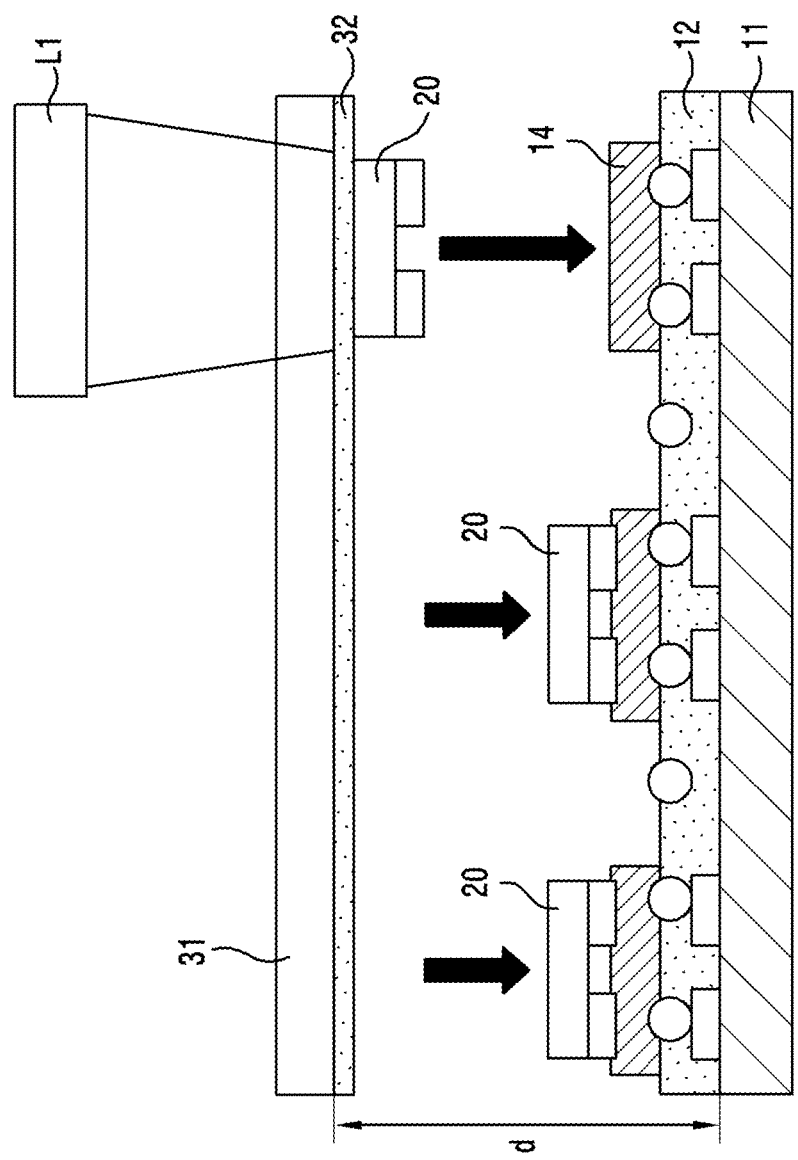

Referring to FIG. 2D, according to one embodiment, the plurality of prepared micro LED chips 20 may be positioned on the substrate 11 to which the anisotropic conductive film 12 is bonded. According to one embodiment, the plurality of micro LED chips 20 may be transferred while being attached onto a carrier substrate 31 by means of a bonding agent 32, and be positioned above the substrate 11 while being spaced a first distance (d) apart from the substrate. According to one embodiment, the first distance (d) may be equal to or shorter than 150 micrometers. The first distance (d) may be equal to or shorter than 100 micrometers.

According to one embodiment, the plurality of manufactured micro LED chips 20 is transferred to and attached onto the carrier substrate 31, and may be then arranged above the substrate 11 in a connection pad-down state while being spaced the first distance (d) apart from the substrate.

When laser L1 is radiated to each of the micro LED chips 20, the bonding agent 32 is ablated, and the attached micro LED chips 20 is jetting toward the bonding layer 14. According to one embodiment, the carrier substrate 31 may be made of a material transmitting a specific wavelength or a material transmitting the laser L1. For example, a material of the carrier substrate 31 may be glass, and the laser L1 may be infrared laser or ultraviolet laser. The seating of each of the micro LED chips 20 on the bonding layer 14 may proceed in order of RGB.

For example, red (R) colored micro LED chips may be firstly arranged on the substrate 11, green (G) colored micro LED chips may be arranged on the substrate 11, and blue (B) colored micro LED chips may be lastly arranged on the substrate 11. When connecting and fixing processes of the micro LED chips 20 are completed, a plurality of pixels including multiple RGBs may be arranged at an equal interval on the substrate 11.

According to one embodiment, the laser L1 may be disposed to be fixed or movable, and the substrate 11 may be disposed to be fixed or movable. For example, when the laser L1 is fixed, the substrate 11 may be disposed to be movable, and when the laser L1 is movable, the substrate 11 may be disposed to be fixed. According to one embodiment, when the laser L1 is fixed, the substrate 11 may be installed to be movable from front to back or side to side.

According to one embodiment, each of the micro LED chips 20 having descended at a predetermined acceleration may be successively attached onto the bonding layer 14, and each of the micro LED chips 20 having descended at a predetermined acceleration may be stably placed on the bonding layer 14. This is because the bonding layer 14 may function as a cushion pad and bonding for the micro LED chips 20.

According to one embodiment, the micro LED chips 20 jetted from the carrier substrate 31 during a laser ablation process may be stably placed on the bonding layer 14 by means of descending due to their own weight and sudden expansion of gas having been generated by the laser ablation process.

Figure 2E:
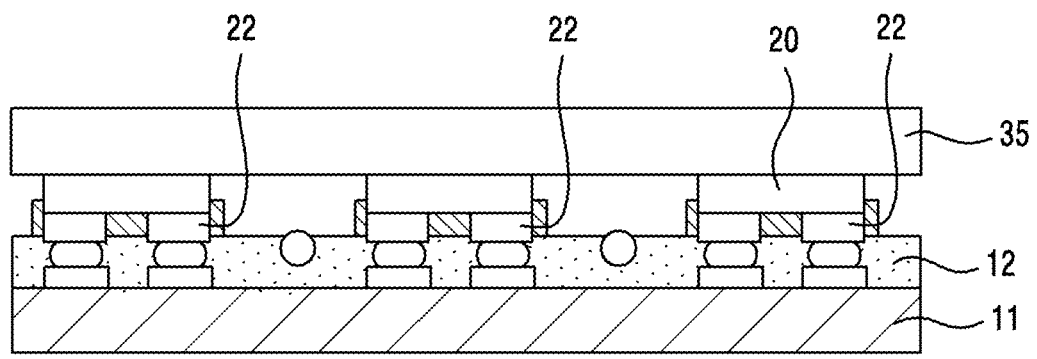

Referring to FIG. 2E, according to one embodiment, heat and pressure may be applied to each of the micro LED chips 20 having been seated on the bonding layer 14 by means of a chuck 35. According to one embodiment, the chuck 35 may apply heat and pressure to the micro LED chips 20 having descended to be seated. The one or more conductive particles 122, which are disposed between the connection pad 22 and the circuit part 110, may be plastically deformed depending on the operation of the chuck 35. The conductive particles 122 disposed between the connection pad 22 and the circuit part 110 may be deformed from an original spherical shape to a flat shape by pressurization of the chuck.

According to one embodiment, the connection pad 22, the plastically deformed conductive particles 122, and the circuit part 110 are electrically connected to each other, and a conductive structure, namely a connection structure of the micro LED chip 20, may be thus provided.

Figure 2F:
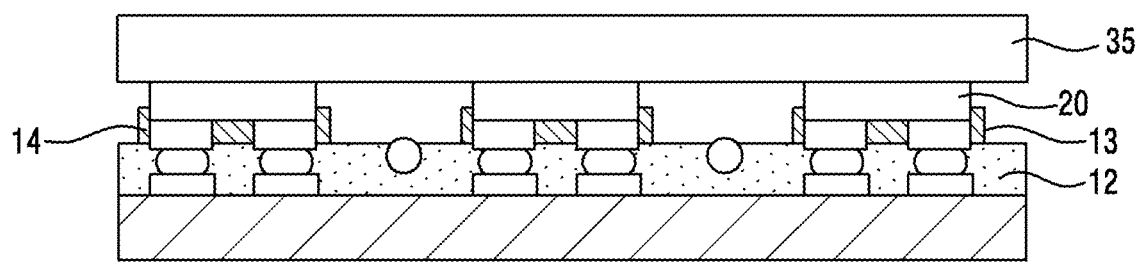

Referring to FIG. 2F, according to one embodiment, the periphery of the conductive structure of the micro LED chip 20, to which heat and pressure have been applied by the chuck 35, may be cured. According to one embodiment, the anisotropic conductive film 12 and the bonding layer 14 are cured to fix the periphery of the conductive structure of the micro LED chip 20. For example, the anisotropic conductive film 12 and the bonding layer 14 may be cured by means of at least one of heat, pressure, ultraviolet rays, infrared rays, moisture, or photoelectrons.

According to one embodiment, during the curing process, the bonding layer 14 and the anisotropic conductive film 12 may be partially mixed together by means of a chemical or physical reaction therebetween, and as necessary, a conductive ball added to the bonding layer 14 may replace or assist the conductive particles 122 to perform an electrical current carrying role between the connection pad 22 and the circuit part 110.

Figure 3A:
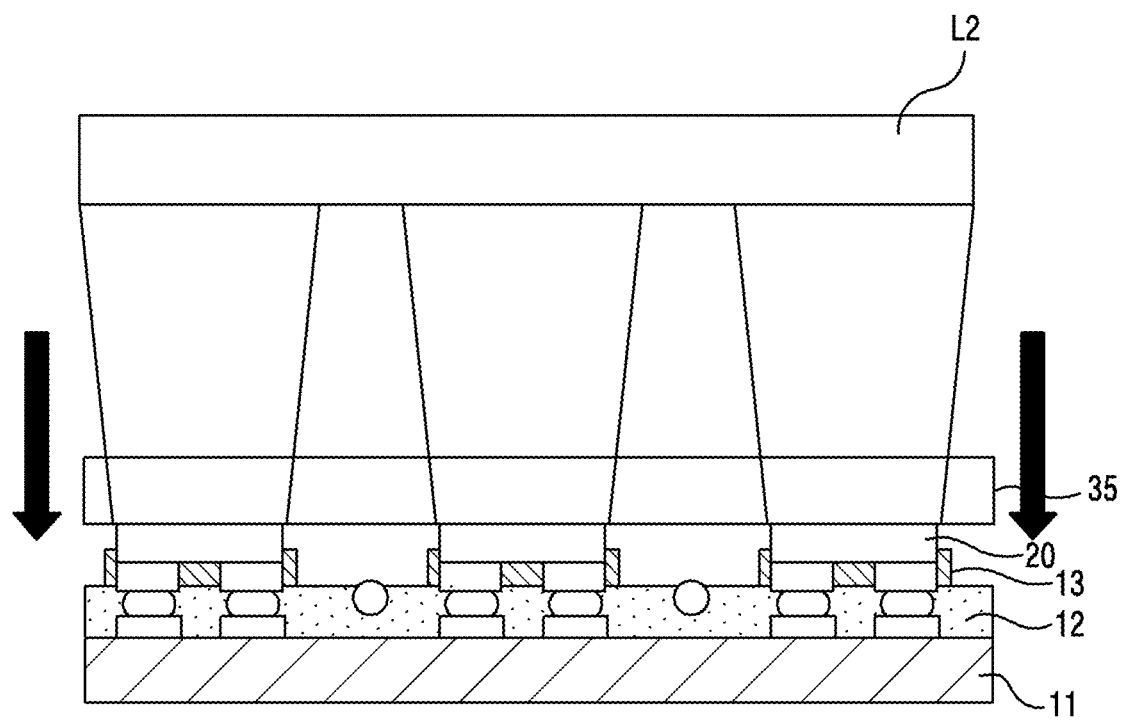
FIGS. 3A and 3B illustrate a cross-sectional view of a laser curing process according to various embodiments.
Figure 3B:
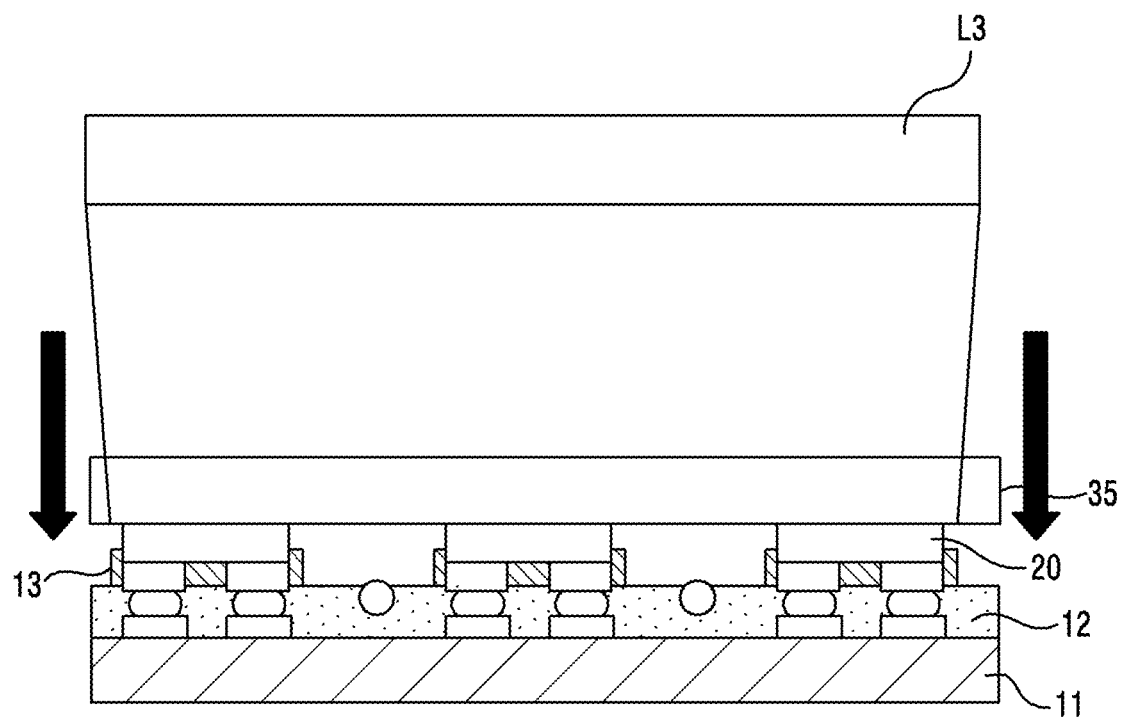

FIGS. 3A and 3B illustrate a cross-sectional view of a laser curing process according to various embodiments.

Referring to FIG. 3A, in a display device (for example, the display device 10 illustrated in FIG. 1) according to one embodiment, when a material of the chuck 35 is a material transmitting laser L2, the anisotropic conductive film 12 and a bonding layer (for example, the bonding layer 14 illustrated in FIG. 2C) may be cured by means of the laser L2. The cured bonding layer may be a bonding strength reinforcing structure 13. According to one embodiment, a material transmitting laser or an available specific wavelength may be used as a material of the chuck 35. For example, glass may be used as the material of the chuck 35. In addition, for example, an infrared laser or an ultraviolet laser may be used as the laser L2. According to one embodiment, the laser L2 may be locally radiated by means of a mask. For example, the laser L2 may be radiated only to the micro LED chips 20 by means of a mask.

According to one embodiment, the laser L2 may be fixed and the substrate 11 may be movable, or the laser L2 may be movable and the substrate 11 may be fixed.

Referring to FIG. 3B, in a display device according to one embodiment, when a material of the chuck 35 is a material transmitting a specific wavelength, the anisotropic conductive film 12 and the bonding strength reinforcing structure 13 (for example, a bonding layer 14) may be cured by using ultraviolet rays or ultraviolet laser beams. For example, glass may be used as the material of the chuck 35. According to one embodiment, ultraviolet rays, or ultraviolet laser L3 may be radiated to the micro LED chips 20 by means of a mask.

According to one embodiment, the laser L3 may be fixed and the substrate 11 may be movable, or the laser L3 may be movable and the substrate 11 may be fixed.

Figure 4:
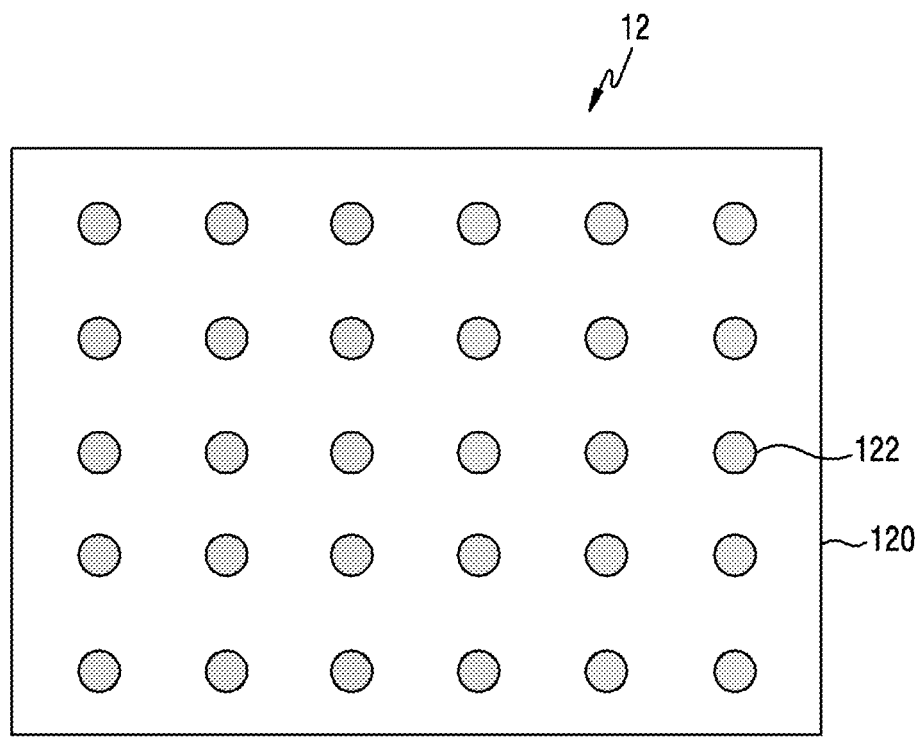
FIG. 4 illustrates an enlarged plan view of a part of an anisotropic conductive film according to various embodiments.

FIG. 4 illustrates an enlarged plan view of a part of the anisotropic conductive film 12 according to various embodiments.

Referring to FIG. 4, the anisotropic conductive film 12, according to one embodiment, is a bonding layer bonded to the substrate 11 by means of heat and pressure, and may include the plurality of conductive particles 122 arranged in the bonding film 120. For example, the plurality of conductive particles 122 have a shape of a ball or a flake, but the present disclosure is not limited thereto.

According to one embodiment, the plurality of conductive particles 122 is metal particles, and may be one of Cu, Pd, Ni, Au, or Ag, or may be metal or a synthetic resin including spherical or flake shaped particles coated with one of them. Each of the conductive particles 122 may have a size of 5.5 micrometers or lower. A distance between the respective conductive particles 122 may be equal to or lower than 50 micrometers.

According to one embodiment, the plurality of conductive particles 122 included in the anisotropic conductive film 12 may be arranged at an equal interval along a widthwise direction and a longitudinal direction of the anisotropic conductive film. However, the present disclosure is not limited thereto, and each of the conductive particles 122 may be arranged at an equal interval along the widthwise direction, may be arranged at an equal interval along the longitudinal direction, or may be arranged intensively only around the connection pad.

Figure 5A:
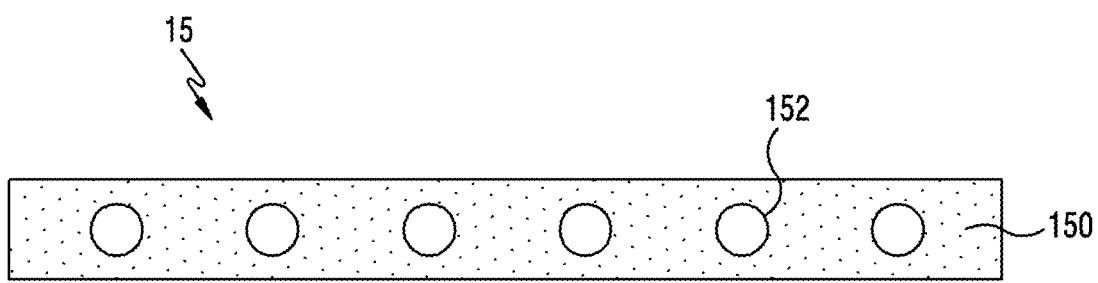
FIGS. 5A and 5B illustrate an enlarged cross-sectional view of a part of an anisotropic conductive film according to various embodiments.
Figure 5B:
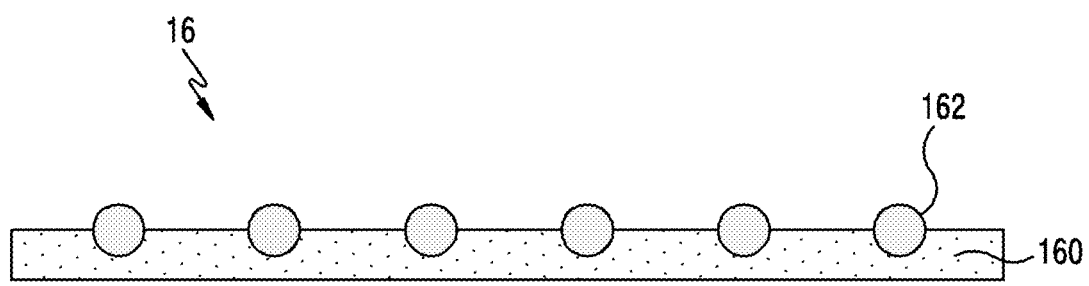

FIGS. 5A and 5B illustrate an enlarged cross-sectional view of a part of the anisotropic conductive film 12 according to various embodiments.

Referring to FIG. 5A, a plurality of conductive particles 152 included in an anisotropic conductive film 15, according to one embodiment, may be arranged at an equal interval within a bonding film 150.

Referring to FIG. 5B, a plurality of conductive particles 162 included in an anisotropic conductive film 16, according to one embodiment, may be partially exposed from a bonding film 160, and parts of the conductive particles may be arranged at an equal interval while being immersed in the bonding film 160.

The anisotropic conductive film 16 illustrated in FIG. 5B may have a structure advantageous for thinning rather than the anisotropic conductive film 15 illustrated in FIG. 5A.

Figure 6:
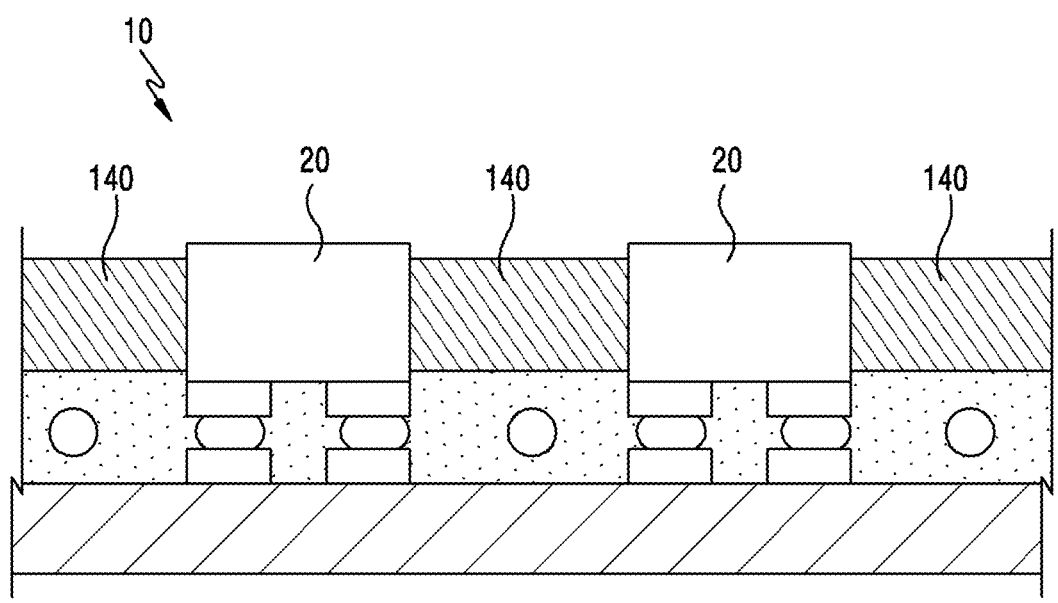
FIGS. 6-8 illustrate an enlarged cross-sectional view of a micro LED display according to various other embodiments.

FIG. 6 illustrates an enlarged cross-sectional view of a micro LED display according to various other embodiments.

Referring to FIG. 6, since a display device 10, according to one embodiment, has the same configuration as the display device 10 illustrated in FIG. 1, except for a bonding layer 140, overlapping descriptions thereof will be omitted.

According to one embodiment, a color of the bonding layer 140 disposed in the display device 10 may be black or opaque. When the color of the bonding layer 140 is black or opaque, it is possible to minimize the influence of light and heat of the light-emitting micro LED chip 20 upon the adjacent micro LED chip 20.

Figure 7:
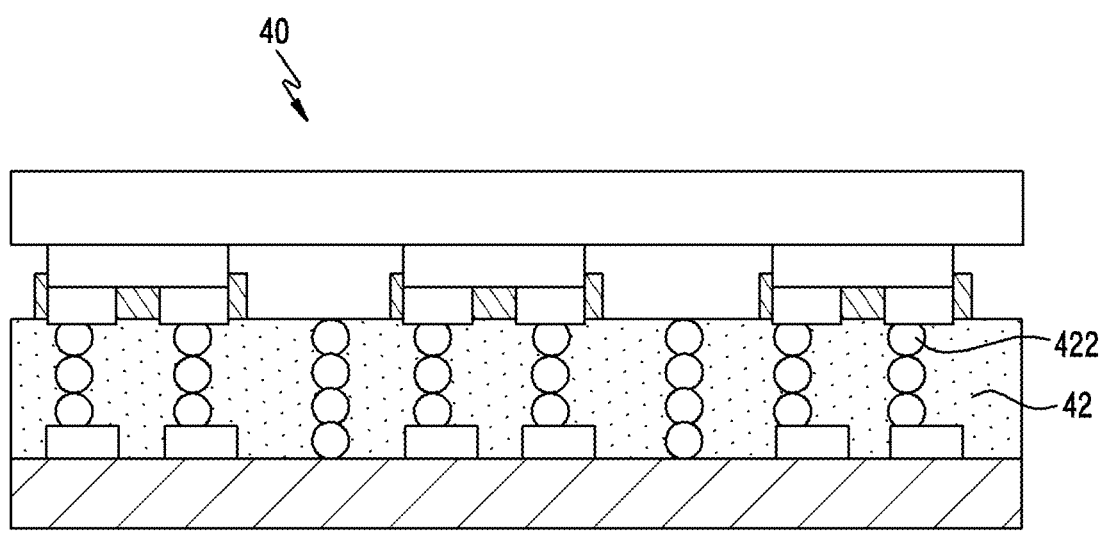

FIG. 7 illustrates an enlarged cross-sectional view of a micro LED display according to various other embodiments.

Referring to FIG. 7, since a display device 40, according to one embodiment, has the same configuration as the display device 10 illustrated in FIG. 1, differing only in an arrangement of a plurality of conductive particles 422 arranged within an anisotropic conductive film 42, overlapping descriptions thereof will be omitted.

According to one embodiment, the plurality of conductive particles 422 arranged at an equal interval may be vertically aligned by means of the applied magnetic field or electric field. When a thickness of the anisotropic conductive film 42 illustrated in FIG. 7 is thicker than a thickness of the anisotropic conductive film 12 illustrated in FIG. 1, a conductive structure may be provided after the plurality of conductive particles 422 is vertically aligned by means of the applied magnetic field or electric field.

Figure 8:
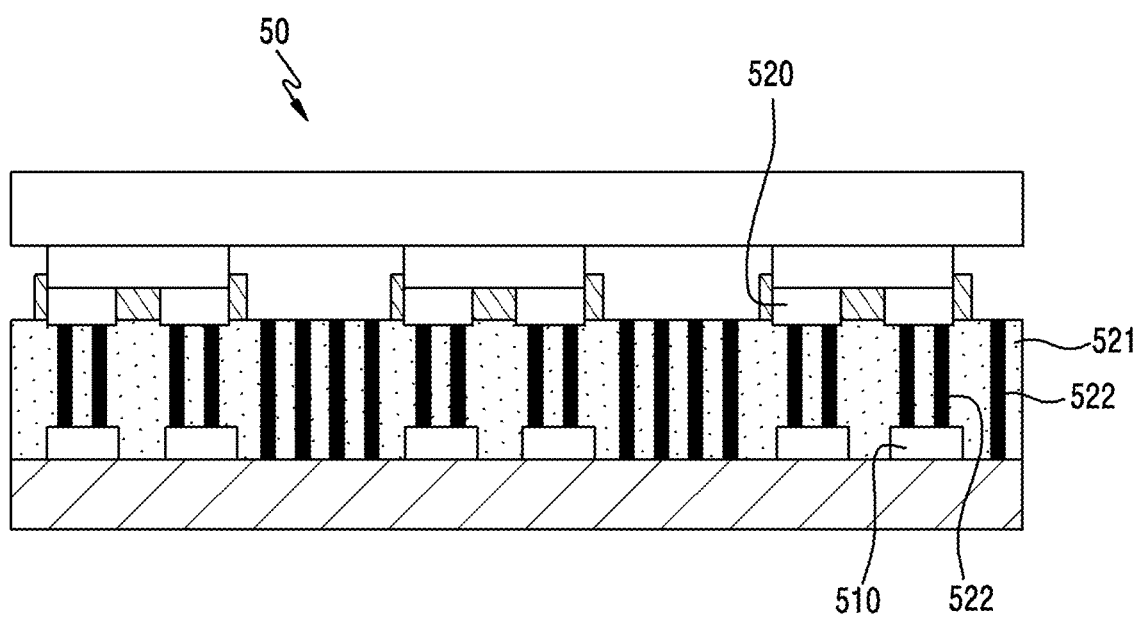

FIG. 8 illustrates an enlarged cross-sectional view of a micro LED display according to various other embodiments.

Referring to FIG. 8, since a display device 50, according to one embodiment, has the same configuration as the display device 10 illustrated in FIG. 1, differing only in a conductive structure between a connection pad and the circuit part 110, overlapping descriptions thereof will be omitted.

According to one embodiment, a connection structure for electrically connecting a connection pad 520 and a circuit part 510 may be obtained through a plurality of conductive columns 522 provided by plating or paste insertion. For example, the plurality of columns 522 is electrical paths obtained by a plurality of holes 521 filled with a conductive material, the holes being formed through a bonding film 520, and the holes 521 may be filled with a conductive material by means of a plating process or filled with a conductive material by means of a paste process.

Figure 9:
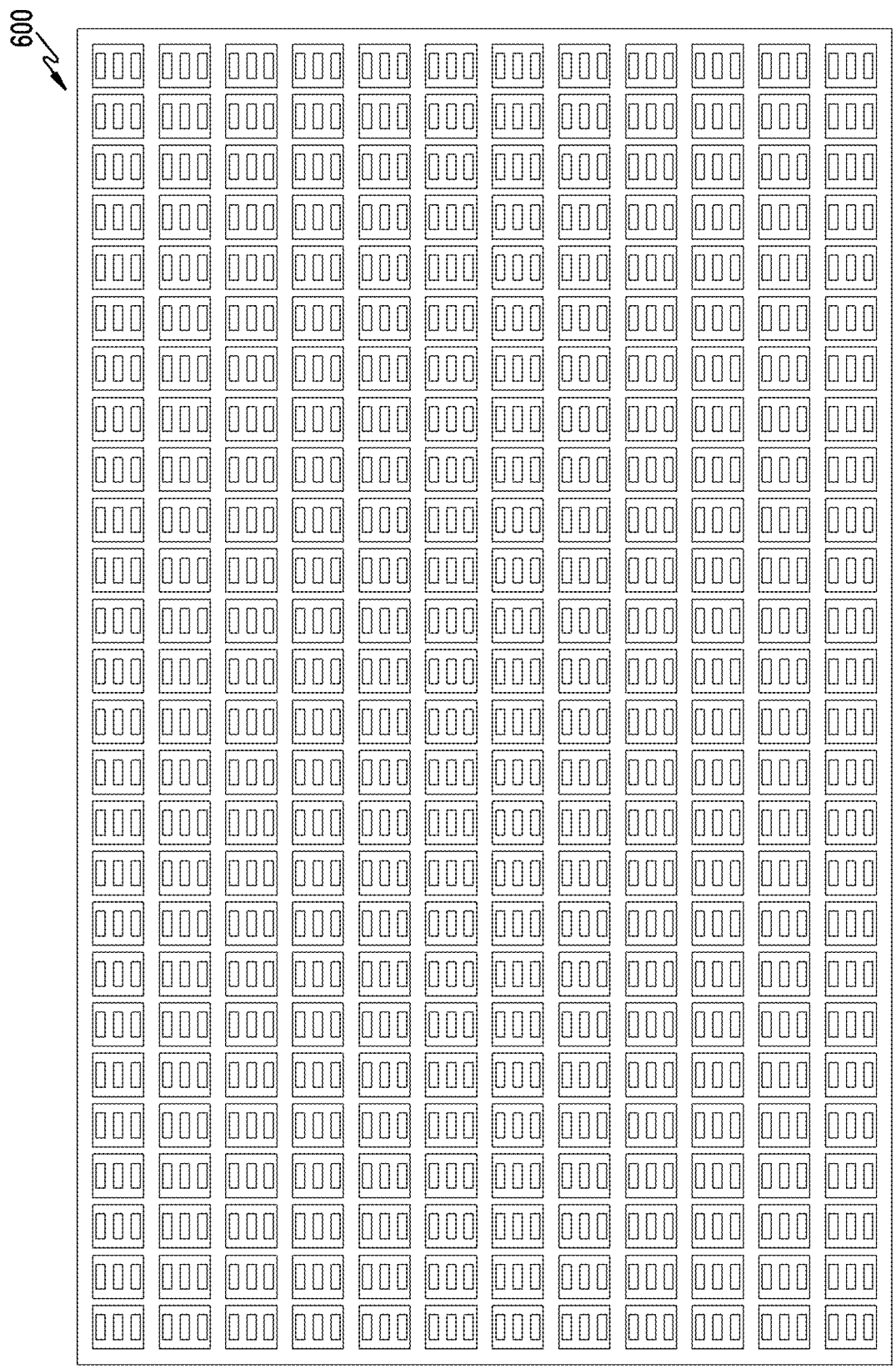
FIG. 9 illustrates a plan view of a micro LED display manufactured using a display manufacturing method according to various embodiments.

FIG. 9 illustrates a plan view of a micro LED display manufactured using a display manufacturing method according to various embodiments.

Referring to FIG. 9, a modularized micro LED display 600 may be mounted in a main board to be manufactured as a large-screen display and manufactured as a display having various sizes.

Figure 10:
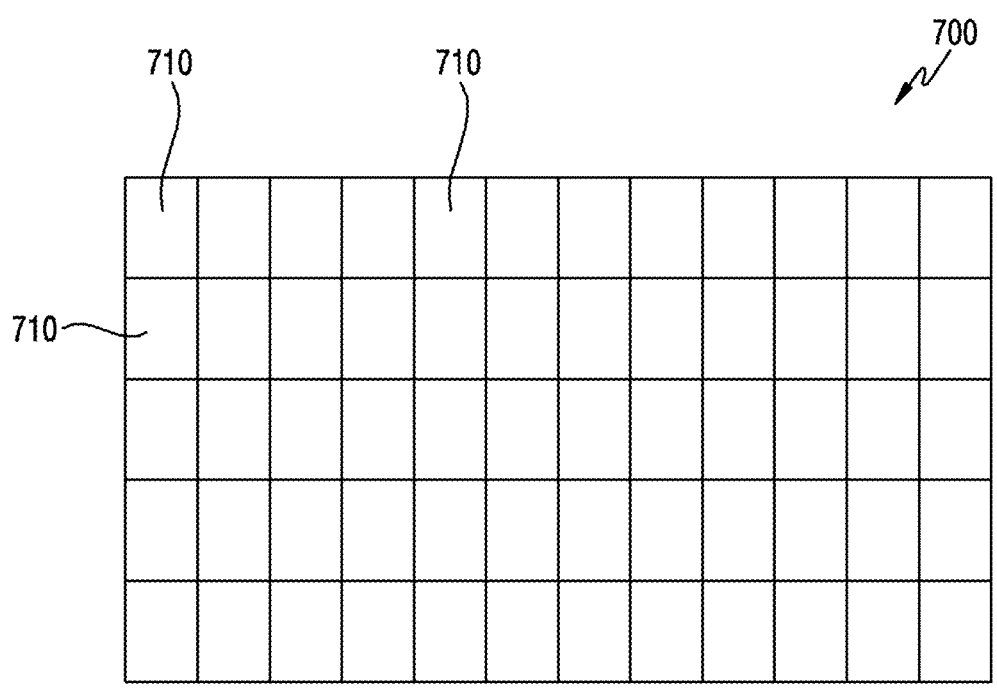
FIG. 10 illustrates a plan view of a large-screen display including micro LED displays combined with each other, which are manufactured using a display manufacturing method according to various embodiments.

FIG. 10 illustrates a plan view of a large-screen display including micro LED displays 710 combined with each other, which are manufactured using a display manufacturing method according to various embodiments.

Referring to FIG. 10, the multiple micro LED displays 710 having been manufactured through the manufacturing process illustrated in FIGS. 2A to 2F may be assembled, so as to be manufactured as various ultrawide micro LED displays 700 (for example, a large-screen television, a large billboard, and the like).

Although the present disclosure has been described with various embodiments, various changes and modifications may be suggested to one skilled in the art. It is intended that the present disclosure encompass such changes and modifications as fall within the scope of the appended claims.

What is claimed is:

1. A method for manufacturing a light-emitting diode (LED) display, the method comprising:
    bonding an anisotropic conductive film including a plurality of conductive particles onto a surface of a substrate including a circuit part;
    forming a bonding layer on the anisotropic conductive film;
    positioning a plurality of micro LED chips on the bonding layer, the plurality of micro LED chips being arranged on a carrier substrate while being spaced a first distance apart from the substrate;
    attaching the plurality of micro LED chips onto the bonding layer using a laser; and
    forming a conductive structure for electrically connecting a connection pad of a micro LED to the circuit part through the plurality of conductive particles by heating and pressurizing,
    wherein the plurality of conductive particles is arranged at an equal interval in the anisotropic conductive film.

2. The method of claim 1, wherein each of the plurality of conductive particles includes a diameter that is equal to or shorter than 5.5 micrometers.

3. The method of claim 1, wherein the bonding layer is applied to an entire portion of the anisotropic conductive film or a periphery of the circuit part.

4. The method of claim 1, wherein the first distance is equal to or shorter than 150 micrometers.

5. The method of claim 1, wherein attaching the plurality of micro LED chips comprises jetting the plurality of micro LED chips to the bonding layer using a laser ablation.

6. The method of claim 1, wherein the bonding layer is a tacky layer that absorbs kinetic energy of the plurality of attached micro LED chips separated from the carrier substrate and temporally fixes the plurality of attached micro LED chips.

7. The method of claim 1, wherein the plurality of conductive particles includes one of Cu, Ni, Au, or Ag.

8. The method of claim 1, wherein the laser or the substrate is movable in left or right directions, or forward or backward directions.

9. The method of claim 1, wherein the carrier substrate includes a wavelength capable of transmitting the laser.

10. The method of claim 1, wherein the plurality of conductive particles positioned between the connection pad and the circuit part is plastically deformed by a pressurization process of a chuck.

11. The method of claim 1, wherein each of the substrate and the carrier substrate is made of one of a glass, a ceramic, or a synthetic resin.

12. The method of claim 1, wherein a second distance between each of the plurality of conductive particles is equal to or shorter than 50 micrometers.

13. The method of claim 1, wherein the plurality of conductive particles arranged between the connection pad and the circuit part comprises metal particles plastically deformed.

14. The method of claim 1, wherein the plurality of conductive particles arranged in an area other than between the connection pad and the circuit part comprises metal particles shaped as a ball or a flake.

15. The method of claim 1, further comprising a bonding strength reinforcing structure disposed on the anisotropic conductive film while surrounding each of the plurality of micro LED chips.

16. The method of claim 1, wherein each of the plurality of micro LED chips is disposed on the surface of the substrate in a connection pad-down state.

* * * * *